(12) United States Patent
Ren et al.

(10) Patent No.: US 10,546,951 B2
(45) Date of Patent: Jan. 28, 2020

(54) TRENCH MOS DEVICE WITH IMPROVED SINGLE EVENT BURN-OUT ENDURANCE

(71) Applicants: University of Electronic Science and Technology of China, Chengdu (CN); Institute of Electronic and Information Engineering of UESTC in Guangdong, Dongguan (CN)

(72) Inventors: Min Ren, Chengdu (CN); Yuci Lin, Chengdu (CN); Chi Xie, Chengdu (CN); Zhiheng Su, Chengdu (CN); Zehong Li, Chengdu (CN); Jinping Zhang, Chengdu (CN); Wei Gao, Chengdu (CN); Bo Zhang, Chengdu (CN)

(73) Assignees: University of Electronic Science and Technology of China, Chengdu (CN); Institute of Electronic and Information Engineering of UESTC in Guangdong, Dongguan (CN)

( * ) Notice: Subject to any disclaimer, the term of this patent is extended or adjusted under 35 U.S.C. 154(b) by 29 days.

(21) Appl. No.: 15/774,291

(22) PCT Filed: Sep. 17, 2016

(86) PCT No.: PCT/CN2016/099165
§ 371 (c)(1),
(2) Date: May 8, 2018

(87) PCT Pub. No.: WO2018/049641
PCT Pub. Date: Mar. 22, 2018

(65) Prior Publication Data
US 2019/0371937 A1 Dec. 5, 2019

(51) Int. Cl.
*H01L 29/78* (2006.01)
*H01L 29/423* (2006.01)

(52) U.S. Cl.
CPC ...... *H01L 29/7813* (2013.01); *H01L 29/4236* (2013.01)

(58) Field of Classification Search
None
See application file for complete search history.

(56) References Cited

U.S. PATENT DOCUMENTS

2009/0242976 A1* 10/2009 Hino ................. H01L 29/41766
257/330
2013/0009256 A1* 1/2013 Okumura ............ H01L 21/0465
257/402

FOREIGN PATENT DOCUMENTS

| CN | 105118862 A | 12/2015 |
|---|---|---|
| CN | 105633137 A | 6/2016 |
| TW | 200411931 A | 7/2004 |

OTHER PUBLICATIONS

Yue Zhang; The Simulation Research of Single-Event Effect in Power UMOSFETs, Electronic Technology & Information Science, China Masters Theses Full-Text Database, ISSN: 1674-0246, Apr. 15, 2014, p. 4, paragraph 2 and figures 1.5 and 2.5.

* cited by examiner

*Primary Examiner* — Jack S Chen
(74) *Attorney, Agent, or Firm* — Gokalp Bayramoglu

(57) ABSTRACT

A trench MOS device with improved single event burnout endurance, applied in the field of semiconductor. The device is provided, in an epitaxial layer, with a conductive type semiconductor pillar connected to a source and a second conductive type current-directing region. Whereby, the trajectory of the electron-hole pairs induced by the single event effect is changed and thus avoids the single event burnout caused by the triggering of parasitic transistors, therefore improving the endurance of the single event burnout of the trench MOS device.

2 Claims, 4 Drawing Sheets

TRENCH MOS DEVICE WITH IMPROVED SINGLE EVENT BURN-OUT ENDURANCE

CROSS REFERENCE TO RELATED APPLICATIONS

This application is the national phase entry of International Application PCT/CN2016/099165, filed on Sep. 17, 2016, the entire contents of which are incorporated herein by reference.

TECHNICAL FIELD

The present invention relates to semiconductor technology, and more particularly to a trench MOS device with improved ability of endurance to single event burnout.

BACKGROUND

With the rapid development of power electronics technology applied to high frequency and high power application field, VDMOS (vertical double-diffusion MOSFET) has become one of the irreplaceable important devices in the field of power electronics. The VDMOS device is a multi-cell device usually formed by double diffusion or ion implantation technology. It features easy integration, high power density, majority carrier conduction and good frequency characteristics. However, there is a large gate-source capacitance within the planar VDMOS, which limits its switching rate. At the same time, due to the existence of Junction Field Effect Transistor (JFET) region within the VDMOS device, the saturation current density is limited by the resistance of the JFET. In the field of low-voltage and low-power MOS devices, trench MOSFET devices have been rapidly developing. Compared with the planar VDMOS, the trench MOSFET device has the advantages of greater channel density, lower power consumption and smaller cell size. Moreover, the trench MOSFET has no JFET effect, so the cell density of the trench MOSFET can be rapidly increased as the feature size of the MOS process decreases.

The irradiation effects of semiconductor devices are complex, because different types of radiation have different impact on the semiconductor devices. There are four types of radiations that can influence the electrical characteristics of semiconductor devices, which are protons, electrons, neutrons and γ rays. The main factors that have an important effect on the microelectronic devices are γ total dose radiation, γ dose rate radiation, neutron radiation and single event effect.

One of the single event effect of the trench MOSFET is Single Event Burnout (SEB). There is a parasitic transistor structure made up of the N+ source, the P-body region and the lightly doped N-drift region of the trench MOSFET, which constitute the emitter region, the base region and the collector region of the parasitic transistor, respectively. In general, the emitter and base of the parasitic transistor are short-circuited by the source metal, which does not affect the external characteristics of the device. In the irradiation environment, the incident high-energy particle produces a large number of electron hole pairs along the incident track, which cause the instantaneous current under the dual role of drift field and diffusion. The drain is applied with a positive voltage and the source is grounded when the device is in off-state. Therefore, the hole current flows through the P-body to the source and produces a voltage drop across the parasitic resistance of the base region. When the voltage drop increases to a certain value, the parasitic transistor turns on. When the drain-source voltage of the MOS transistor is larger than the breakdown voltage, the current flowing through the transistor can have a further feedback, to let the electric current density of depletion region increase gradually, resulting in secondary breakdown between the drain and the source. If the junction temperature exceeds the allowable value, the source-drain junction burns down. Reducing the resistance of the P-body region below the N+ source region of the trench MOSFET device, that is, increasing the concentration of P-body region is an effective way to improve the device's ability against single event burnout. However, considering the threshold of the device, the concentration of P-body area cannot be too large. Therefore, the reduction in the resistance of P-body region under the N+ source is limited, and the traditional structure has little endurance ability to single event burnout.

SUMMARY

In order to solve the problems above, a trench MOS device with improved single event burn-out endurance is provided in the present invention. According to an aspect of the present invention, the cell structure of the trench MOS device is arranged from bottom to top as follows: a drain metal electrode, a first conductive type semiconductor substrate, a first conductive type semiconductor epitaxial layer, and a source metal electrode. In the top of the first conductive type semiconductor epitaxial layer, there are second conductive type semiconductor body regions, first conductive type semiconductor source regions, second conductive type semiconductor body contact regions, and trench gate. The second conductive type semiconductor body contact region is located between two adjacent first conductive type semiconductor source regions, and both the upper surface of the first conductive type semiconductor source region and that of the second conductive type semiconductor body contact region are connected to the source metal electrode. The second conductive type semiconductor body region is located just below the first conductive type semiconductor source region and the second conductive type semiconductor body contact region, and the upper surface of the second conductive type semiconductor body region contacts with the lower surface of the first conductive type semiconductor source region and the lower surface of the second conductive type semiconductor body contact region. The trench gate is located on the side of the second conductive type semiconductor body region and the first conductive type semiconductor source region which is composed of a gate dielectric layer and a gate conductive material located in the gate dielectric layer. An isolation dielectric layer is provided between the upper surface of the gate conductive material and the source metal electrode. The side surface of the dielectric layer is in contact with the side surface of the first conductive type semiconductor source region, and the side surface of the gate dielectric layer is in contact with the side surfaces of the second conductive type semiconductor body region and the first conductive type semiconductor source region. The junction depth of the gate dielectric layer is larger than the junction depth of the second conductive type semiconductor body region.

According to another aspect of the present invention, in the first conductive type semiconductor epitaxial layer, there are a second conductive type semiconductor pillar and a second conductive type semiconductor current-directing region. The upper surface of the second conductive type semiconductor pillar is connected to the lower surface of the source metal electrode, the side surface of the second conductive type semiconductor pillar is in contact with the gate dielectric layer. The second conductive type semiconductor pillar includes a metal electrode connected to the lower surface of the source metal electrode. The side of the second conductive type current-directing region is in contact with the second conductive type semiconductor pillar, the upper surface of the second conductive type current-directing region is in contact with the lower surface of the gate dielectric layer, and the lateral width of the second conductive type current-directing region is larger than that of the gate dielectric layer. The lateral width of the portion of the second conductive type current-directing region exceeding the lower surface of the gate dielectric layer is also larger than that of the first conductive type semiconductor source region, while the portion of the second conductive type current-directing region exceeding the lower surface of the gate dielectric layer extends in the direction near the second conductive type semiconductor body region. The second conductive type semiconductor pillar contains recombination centers to reduce the carrier lifetime.

According to further aspects of the present invention, in the first conductive type semiconductor epitaxial layer, there are one or more current-directing regions which are located below the trench gate and side surfaces of the current-directing regions are contacted with the second conductive type semiconductor pillar.

Compared to the conventional structure, the present invention greatly improves the ability of the trench MOSFET to resist single event burnout.

BRIEF DESCRIPTION OF THE DRAWINGS

FIG. 2(a) is a schematic cross-sectional view showing the electron flow and the hole flow in the trench MOS device of the present invention when the high-energy particle is incident at the position a.

FIG. 2(b) is a schematic cross-sectional view showing the electron flow and the hole flow in the trench MOSFET of the conventional structure when the high-energy particle is incident at the position a.

DETAILED DESCRIPTION

In the following detailed description, the features of the various exemplary embodiments may be understood accompanying with the drawings.

Embodiment 1

Figure 1:
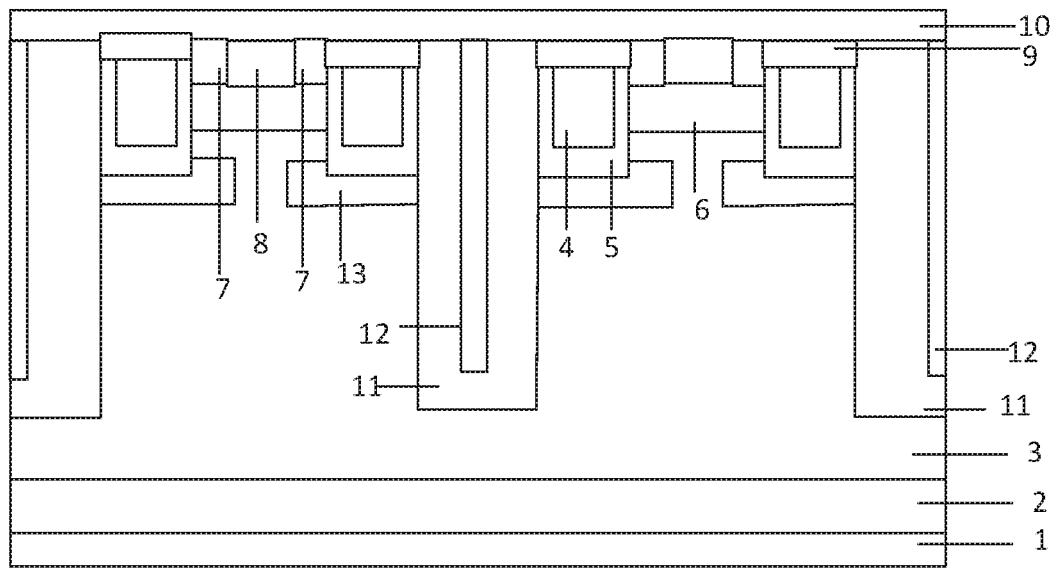
FIG. 1 is a schematic cross-sectional view of the trench MOS device provided in the embodiment 1.

Referring to FIG. 1, a schematic cross-sectional view of the trench MOS device provided in the embodiment 1 is shown. A trench MOS device with improved single event burn-out endurance, from bottom to top includes: drain metal electrode 1, first conductive type semiconductor substrate 2, first conductive type semiconductor epitaxial layer 3, and source metal electrode 10. In the top of the first conductive type semiconductor epitaxial layer 3, there are second conductive type semiconductor body regions 6, first conductive type semiconductor source regions 7, second conductive type semiconductor body contact regions 8 and trench gates 4. The second conductive type semiconductor body contact region 8 is located between two adjacent first conductive type semiconductor source regions 7, and both, the upper surface of the first conductive type semiconductor source region 7 and the upper surface of the second conductive type semiconductor body contact region 8 are connected to the source metal electrode 10. The second conductive type semiconductor body region 6 is located just below the first conductive type semiconductor source region 7 and the second conductive type semiconductor body contact region 8, and the upper surface of the second conductive type semiconductor body region 6 contacts with the lower surface of the first conductive type semiconductor source region 7 and the lower surface of the second conductive type semiconductor body contact region 8. The trench gate 4 made of conductive material is located on the side of the second conductive type semiconductor body region 6 and the first conductive type semiconductor source region 7, and trench gate 4 is surrounded by the gate dielectric layer 5. An isolation dielectric layer 9 is provided between the upper surface of the trench gate 4 made of conductive material and the source metal electrode 10. The side surface of the dielectric layer 9 is in contact with the side surface of the first conductive type semiconductor source region 7, and the side surface of the gate dielectric layer 5 is in contact with the side surfaces of the second conductive type semiconductor body region 6 and the first conductive type semiconductor source region 7. The junction depth of the gate dielectric layer 5 is larger than the junction depth of the second conductive type semiconductor body region 6. Furthermore, in the first conductive type semiconductor epitaxial layer 3, there are second conductive type semiconductor pillar 11 and second conductive type semiconductor current-directing region 13. The upper surface of the second conductive type semiconductor pillar 11 is connected to the lower surface of the source metal electrode 10, the side surface of the second conductive type semiconductor pillar 11 is contacted with the gate dielectric layer 5. The second conductive type semiconductor pillar 11 includes a metal electrode 12 connected to the lower surface of the source metal electrode 10. The side of the second conductive type current-directing region 13 is in contact with the second conductive type semiconductor pillar 11, the upper surface of the second conductive type current-directing region 13 is in contact with the lower surface of the gate dielectric layer 5, and the lateral width of the second conductive type current-directing region 13 is larger than that of the gate dielectric layer 5. The lateral width of the portion of the second conductive type current-directing region 13 exceeding the lower surface of the gate dielectric layer 5 is also larger than that of the first conductive type semiconductor source region 7, while the portion of the second conductive type current-directing region 13 exceeding the lower surface of the gate dielectric layer 5 extends in the direction near the second conductive type semiconductor body region 6. The second conductive type semiconductor pillar 11 contains recombination centers to reduce the carrier lifetime. In the embodiment 1, the first conductive type semiconductor is an N-type semiconductor.

The working principle of the trench MOS device provided by embodiment 1 will be explained as follows.

Figure 2:
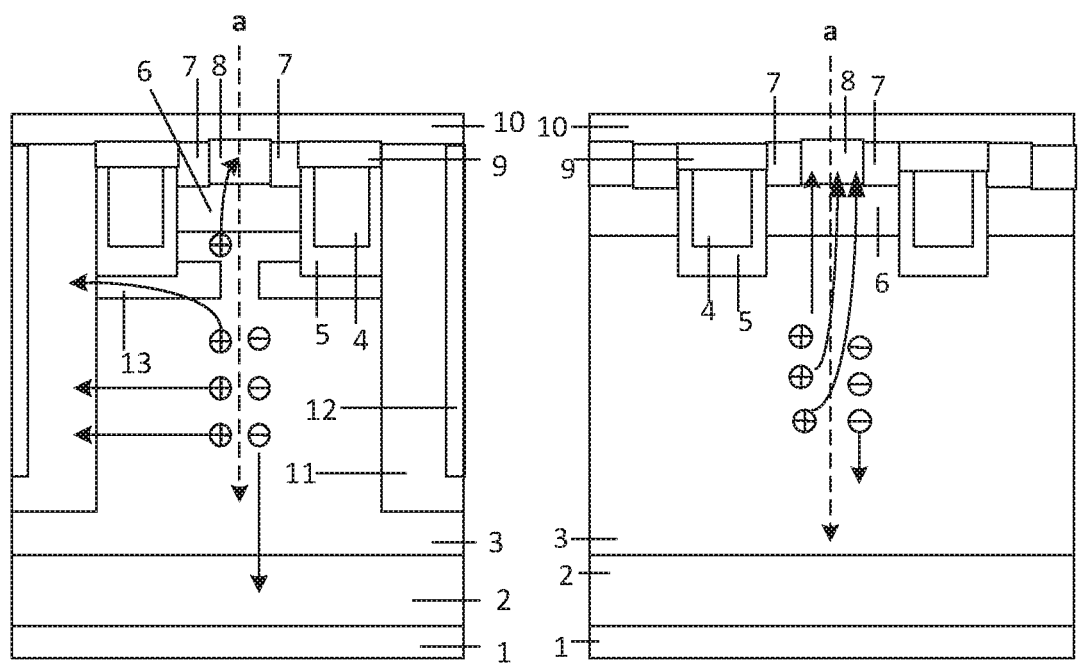

As shown in FIG. 2 (b), when a single-particle is incident at position a of the conventional trench MOSFET, the electron-hole pairs are excited along the single event trajectory. The holes can only flow through the P-body region to the source, so that the parasitic transistor can be easily turned on, resulting in single event burnout. As shown in FIG. 2 (a), when a single-particle is incident at position a of the trench MOS device of the present invention, the electron-hole pairs are excited by the high-energy particle. The electrons are received by the drain electrode and only a small number of the holes pass through the P-body region, while the majority of the holes move to the low resistance P-pillar 11 due to the introduction of the highly doped P-pillar 11 and the hole current-directing region 13 connected to the source. Since the low-resistance P-pillar 11 has metal electrode 12 connected to the source electrode 10 and the low-resistance P-pillar 11 has a low lifetime of carriers, the holes quickly disappear in the P-pillar 11. Since there is no n-type region in the P-pillar 11, there is no parasitic transistor, thus effectively avoiding the triggering of the parasitic transistor.

Figure 3A:
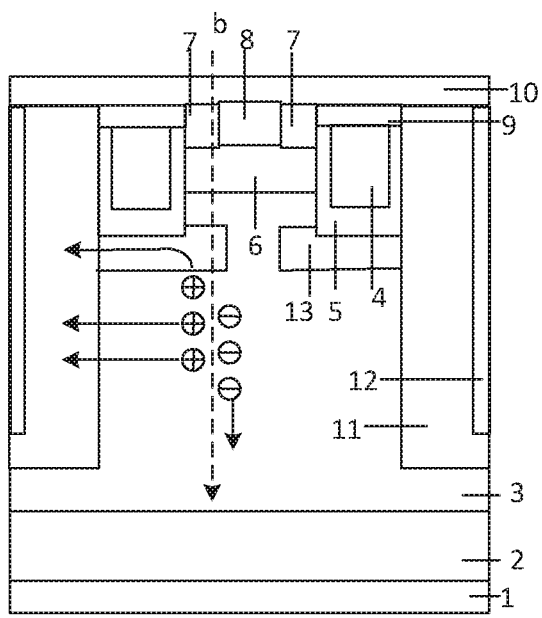
FIG. 3(a) a schematic cross-sectional view showing the electron flow and the hole flow in the trench MOS device of the present invention when the high-energy particle is incident at the position b.
Figure 3:
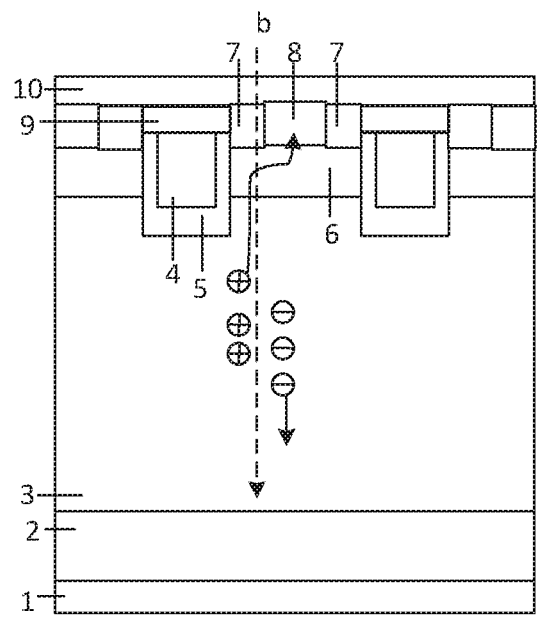
FIG. 3(b) a schematic cross-sectional view showing the electron flow and the hole flow in the trench MOSFET of the conventional structure when the high-energy particle is incident at the position b.

As shown in FIG. 3 (b), when a single-particle is incident at position b of the conventional trench MOSFET, the electron-hole pairs are excited along the event trajectory. Similarly, the holes can only flow through the P-body region below the N+ source region to the source, so that the parasitic transistor can be easily turned on, resulting in single event burnout. As shown in FIG. 3 (a), when a single-particle is incident at position b of the trench gate MOSFET of the present invention, the high-energy particle is excited to generate electron-hole pairs similarly. The electrons are received by the drain and almost all of the holes move to the low resistance P-pillar 11 due to the introduction of the highly doped guiding region 13 connected to the source. Since the low-resistance P-pillar 11 has a metal electrode 12 connected to the source electrode 10 and the low-resistance P-pillar 11 has a low lifetime of carriers, the holes quickly disappear in the P-pillar 11. Since there is no n-type region in the P-pillar 11, there is no parasitic transistor, thus effectively avoiding the opening of the parasitic transistor.

Figure 4:
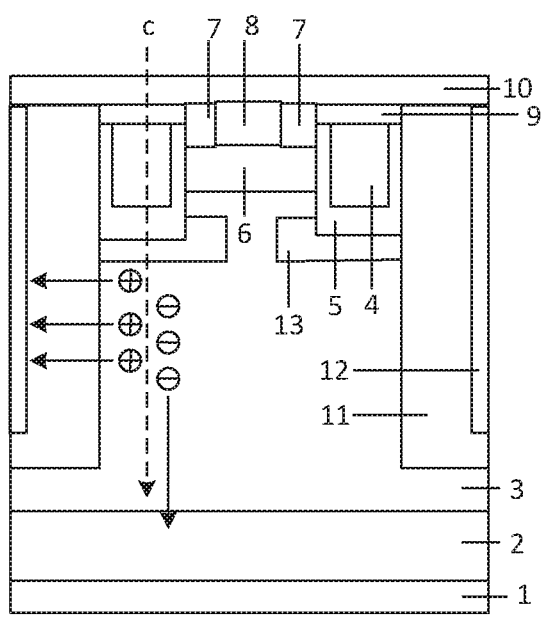
FIG. 4 is a schematic cross-sectional view showing the electron flow and the hole flow in the trench MOS device of the present invention when the high-energy particle is incident at the position c.

As shown in FIG. 4, when a single-particle is incident at position c of the trench MOS device of the present invention, almost all of the holes pass through the hole current-directing region 13 and the P-pillar 11 to the source, and therefore effectively improve the single event burn-out endurance of the trench MOS device.

Figure 5:
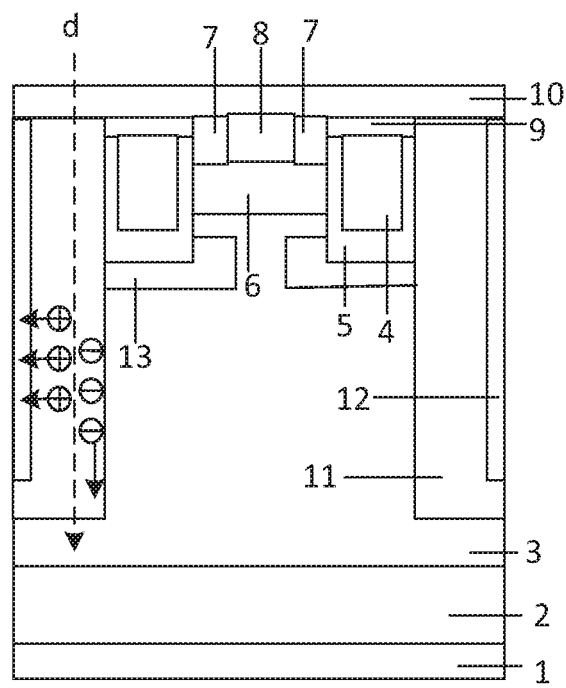
FIG. 5 a schematic cross-sectional view showing the electron flow and the hole flow in the trench MOS device of the present invention when the high-energy particle is incident at the position d.

As shown in FIG. 5, when a single-particle is incident at position d of the trench gate MOSFET of the present invention, almost all holes pass through the P-pillar 11 to the source, and therefore effectively improve single event burn-out endurance.

Embodiment 2

Figure 6:
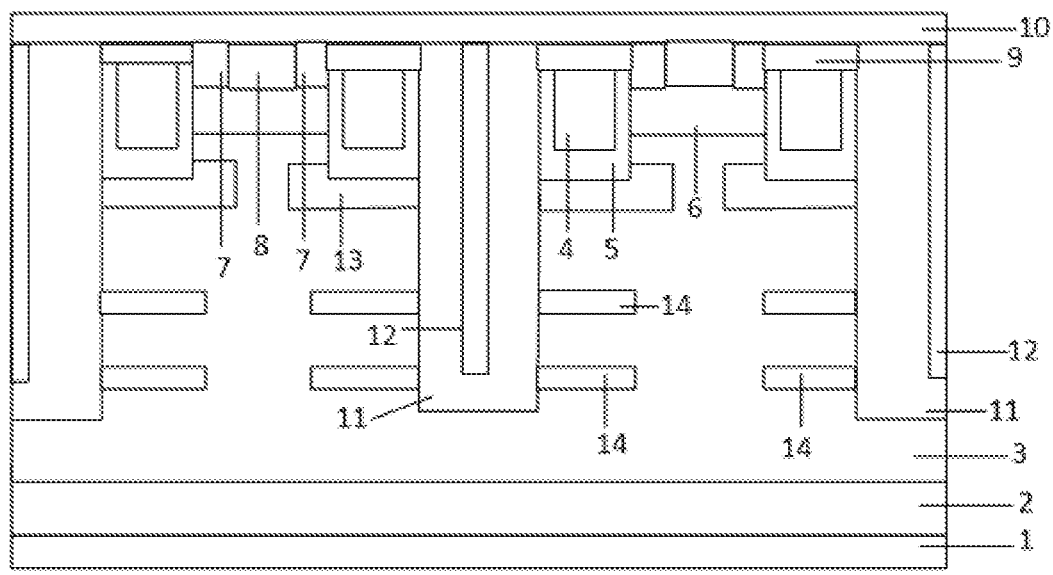
FIG. 6 a schematic cross-sectional view of the trench MOS device as provided in the embodiment 2.

As shown in FIG. 6, the structure of embodiment 2 is based on the structure of embodiment 1. In the embodiment 2, one or more of the second conductive type current-directing regions 14 are added to the side of the low-resistance second conductive type semiconductor pillar 11 to further improve its ability to resist to single event burnout.

Embodiment 3

Figure 7:
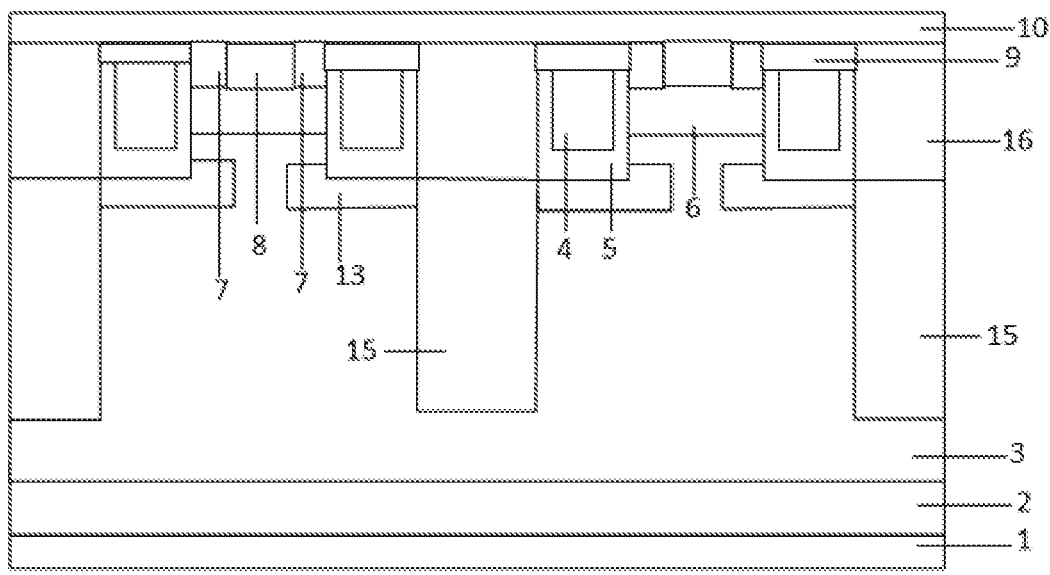
FIG. 7 a schematic cross-sectional view of the trench MOS device as provided in the embodiment 3.

As shown in FIG. 7, the structure of embodiment 3 is based on the structure of embodiment 1. In the embodiment 3, the second conductive type semiconductor pillar 11 and the metal electrode 12 are replaced with the highly doped second conductive type semiconductor region 15 and the second conductive type semiconductor region 16 contains a large number of recombination centers.

Embodiment 4

Figure 8:
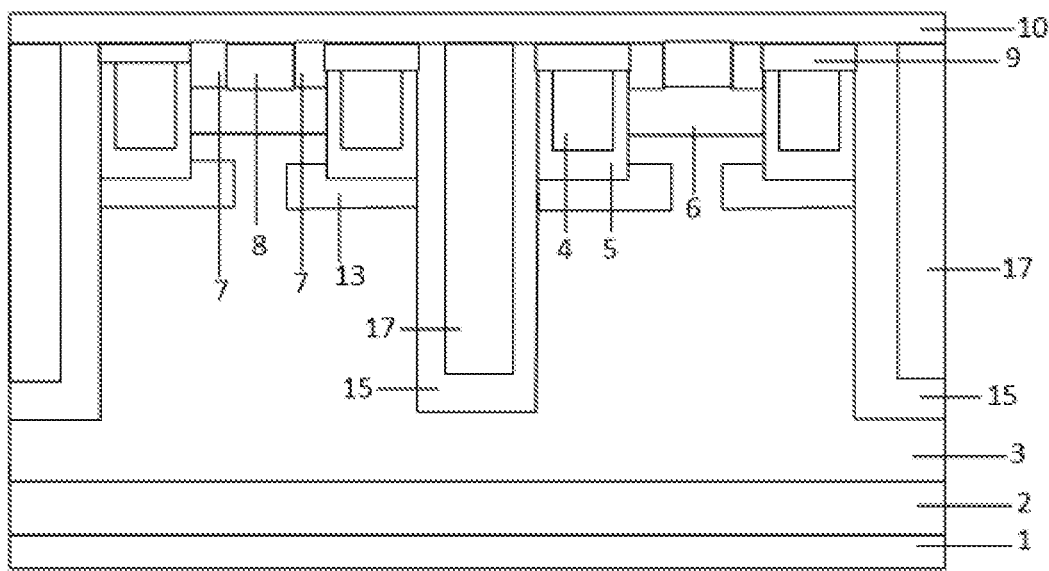
FIG. 8 a schematic cross-sectional view of the trench MOS device as provided in the embodiment 4.

As shown in FIG. 8, the structure of embodiment 4 is based on the structure of embodiment 1. In the embodiment 4, the second conductive type semiconductor pillar 11 and the metal electrode 12 are replaced with the highly doped second conductive type semiconductor region 15 and the second conductive type semiconductor region 17 contains a large number of recombination centers.

What is claimed is:

1. A trench MOS device with improved single event burn-out endurance, comprising a cell structure from bottom to top comprising:

a drain metal electrode, a first conductive type semiconductor substrate, a first conductive type semiconductor epitaxial layer, and a source metal electrode; wherein in the top of the first conductive type semiconductor epitaxial layer there are a second conductive type semiconductor body region, a plurality of first conductive type semiconductor source regions, a second conductive type semiconductor body contact region and a trench gate; the second conductive type semiconductor body contact region is located between two adjacent first conductive type semiconductor source regions, and an upper surface of the first conductive type semiconductor source region and an upper surface of the second conductive type semiconductor body contact region are contacted with the source metal electrode; the second conductive type semiconductor body region is located just below the first conductive type semiconductor source region and the second conductive type semiconductor body contact region, and an upper surface of the second conductive type semiconductor body region is connected to a lower surface of the first conductive type semiconductor source region and a lower surface of the second conductive type semiconductor body contact region; the trench gate is located on a side of the second conductive type semiconductor body region and a side of the first conductive type semiconductor source region, the trench gate is surrounded by a gate dielectric layer and made of a conductive material located in the gate dielectric layer; an isolation dielectric layer is provided between an upper surface of the trench gate and the source metal electrode; a side surface of the dielectric layer is contacted with a side surface of the first conductive type semiconductor source region, and a side surface of the gate dielectric layer is in contact with a side surface of the second conductive type semiconductor body region and the side surface of the first conductive type semiconductor source region; a depth of the gate dielectric layer is larger than a junction depth of the second conductive type semiconductor body region; and wherein, in the first conductive type semiconductor epitaxial layer, there are a second conductive type semiconductor pillar and a second conductive type semiconductor current-directing region; an upper surface of the second conductive type semiconductor pillar is in contact with a lower surface of the source metal electrode, a side surface of the second conductive type semiconductor pillar is in contact with the gate dielectric layer; the second conductive type semiconductor pillar comprises a metal electrode connected to the lower surface of the source metal electrode; a side of the second conductive type current-directing region is connected to the second conductive type semiconductor pillar, an upper surface of the second conductive type current-directing region is connected to a lower surface of the gate dielectric layer, and a lateral width of the second conductive type current-directing region is larger than a lateral width of the gate dielectric layer; the lateral width of the portion of the second conductive type current-directing region exceeding the lower surface of the gate dielectric layer is also larger than a lateral width of the first conductive type semiconductor source region, while a portion of the second conductive type current-directing region exceeding the lower surface of the gate dielectric layer extends in a direction near the second conductive type semiconductor body region; and the second conductive type semiconductor pillar contains recombination centers to reduce a carrier lifetime.

2. The trench MOS device of claim 1, wherein one or more of the second conductive type-current-directing regions are in the first conductive type semiconductor epitaxial layer and the second conductive type current-directing regions are located below the trench gate and a plurality of side surfaces of the second current-directing regions are in contact with the second conductive type semiconductor pillar.

* * * * *